United States Patent
Hara et al.

(10) Patent No.: US 6,934,902 B2
(45) Date of Patent: Aug. 23, 2005

(54) CRC ENCODING CIRCUIT, CRC ENCODING METHOD, DATA SENDING DEVICE AND DATA RECEIVING DEVICE

(75) Inventors: Kiyomi Hara, Tokyo (JP); Takao Inoue, Tokyo (JP)

(73) Assignee: Yokogawa Electric Corporation, Tokyo (JP)

(*) Notice: Subject to any disclaimer, the term of this patent is extended or adjusted under 35 U.S.C. 154(b) by 592 days.

(21) Appl. No.: 09/983,490

(22) Filed: Oct. 24, 2001

(65) Prior Publication Data

US 2002/0053059 A1 May 2, 2002

(30) Foreign Application Priority Data

Oct. 31, 2000 (JP) ....................................... 2000-333090

(51) Int. Cl.[7] ............................................. H03M 13/00
(52) U.S. Cl. ...................... 714/757; 714/774; 714/758
(58) Field of Search ................................ 714/757, 755, 714/774, 758, 779

(56) References Cited

U.S. PATENT DOCUMENTS 3,678,469 A * 7/1972 Freeman et al. ............. 714/779
6,701,478 B1 * 3/2004 Yang et al. .................. 714/757

* cited by examiner

Primary Examiner—Joseph D. Torres
(74) Attorney, Agent, or Firm—Oliff & Berridge, PLC

(57) ABSTRACT

A CRC encoding circuit for generating CRC bits in accordance with initial parallel data having remainder portion data in a last column of the initial parallel data. A first parallel encoding unit is included for generating first CRC bits in accordance with the initial parallel data other than the remainder portion data. A CRC bits selector selects second CRC bits having predetermined number of bytes, from the first CRC bits generated by the first parallel encoding unit. A parallel data selector selects second parallel data having the same number of bytes as the second CRC bits, from the remainder portion data. A second parallel encoding unit generates third CRC bits in accordance with the second CRC bits and the second parallel data

18 Claims, 4 Drawing Sheets

CRC ENCODING CIRCUIT, CRC ENCODING METHOD, DATA SENDING DEVICE AND DATA RECEIVING DEVICE

BACKGROUND OF THE INVENTION

1. Field of Invention

The present invention relates to a CRC encoding circuit for generating CRC bits from parallel data which is inputted as variable-length data, and to a CRC encoding method therefor. Further, the present invention relates to a data sending device and a data receiving device for detecting an error of data in the data communication by using the CRC encoding circuit.

2. Description of Related Art

According to an earlier development, a CRC (Cyclic Redundancy Check) which has high ability to detect an error in a digital communication, is used. The CRC means an error detection method for detecting an error of data by making a comparison between the CRC bits generated in a sender and the CRC bits generated in a receiver.

Recently, for example, like POS (PPP Over SONET/SDH), the high-speed variable-length data communication which performs communication from end to end by framing a low-speed variable-length data frame (PPP frame) over a high-speed variable-length data frame (SONET/SDH frame), is utilized widely. A CRC encoding circuit which generates CRC bits in accordance with the inputted n-byte(s) parallel data, has been introduced as means for detecting an error of data in such high-speed variable-length data communication.

Hereinafter, a former CRC encoder will be explained with reference to the drawings. FIG. 3 shows circuit composition of a CRC encoding circuit 21. As shown in FIG. 3, a CRC encoding circuit 21 mainly comprises a 16-bytes parallel CRC encoder 22, each n-byte(s) parallel CRC encoder 23 to 37 (n=1 to 15), and a selector (SEL) 38.

In the 16-bytes parallel data outputted from an external circuit, the parallel data other than the remainder portion data of the last column is encoded by the 16-bytes parallel CRC encoder 22. As a result, CRC bits are outputted as an encoded interim result. On the other hand, the remainder portion data of the last column is encoded by any one of the n-byte(s) parallel CRC encoders corresponding to the number of the byte(s) of the inputted remainder portion data, in accordance with the encoded interim result, and then is outputted to the SEL 38. The SEL 38 selects the desired CRC bits from the inputted plurality of CRC bits, and outputs the desired CRC bits as a final encoded result.

FIG. 4 is the view showing circuit composition of a former CRC encoding circuit 41. As shown in FIG. 4, the CRC encoding circuit 41 comprises a 16-bytes parallel CRC encoder 42, a byte serializer 43, a 1-byte serial CRC encoder 44, and a selector (SEL) 45.

In the 16-bytes parallel data outputted from an external circuit, the parallel data other than the remainder portion data of the last column is encoded by the 16-bytes parallel CRC encoder 42. As a result, CRC bits are outputted as an encoded interim result. On the other hand, the remainder portion data of the last column is converted to bytes serial data by the byte serializer 43. The converted data is encoded by the 1-byte serial CRC encoder 44 in accordance with the CRC bits, and is outputted to the SEL 45. Then, the SEL 45 selects the desired CRC bits from the inputted plurality of CRC bits, and outputs the desired CRC bits as a final encoded result.

Although the above-mentioned CRC encoding circuits 21 and 41 were useful as a remedy for processing less than 16 bytes of data, there were the following problems. Firstly, in the case that, for example, variable-length data is 16-bytes data, a total of 16 n-byte(s) parallel CRC encoders including the CRC encoder(s) which is not actually used, are required in the CRC encoding circuit 21. Thus, a total of $2^n-1$ byte(s) parallel CRC encoders are required as the number of bytes of the inputted $2^n$-byte(s) parallel data increases. Therefore, the manufacturing costs of the CRC encoding circuit increases with the circuit scale of the CRC encoding circuit.

Further, in the case of the CRC encoding circuit 41, although the generation of CRC bits can be realized with one byte parallel CRC encoder, the 1-byte serial CRC encoder is to be used $2^n-1$ times at the maximum when byte(s) parallel data is converted to byte(s) serial data. Thus, in the case that the n of the inputted $2^n$-bytes parallel data is 2 or more, variable-length data cannot be processed in sequential order.

SUMMARY OF THE INVENTION

An object of the present invention is to provide a CRC encoding circuit and a CRC encoding method which can suppress the number of the CRC encoders to be used and generate CRC bits in accordance with $2^n$-bytes parallel data inputted in sequential order as variable-length data.

In order to solve the above problems, in accordance with a first aspect of the invention, a CRC encoding circuit for generating CRC bits in accordance with an initial parallel data having a remainder portion data in a last column of the initial parallel data, comprises:
- a first parallel encoding unit for generating first CRC bits in accordance with the initial parallel data other than the remainder portion data;
- a CRC bits selector for selecting second CRC bits having predetermined number of bytes, from the first CRC bits generated by the first parallel encoding unit;
- a parallel data selector for selecting a second parallel data having the same number of bytes as the second CRC bits, from the remainder portion data; and
- a second parallel encoding unit for generating third CRC bits in accordance with the second CRC bits and the second parallel data.

The initial parallel data may be $2^n$-bytes parallel data, and the predetermined number may be $2^{n-m}$, where n is a natural number and m is a natural number selected from 1 to n.

The CRC encoding circuit may further comprise:
- a detecting unit for detecting the remainder portion data from the last column of the initial parallel data; and
- wherein the parallel data selector selects the second parallel data having the predetermined number of bytes, from the reminder portion data detected by the detecting unit.

The initial parallel data may be a variable-length data.

In accordance with a second aspect of the invention, a CRC encoding method for generating CRC bits in accordance with an initial parallel data having a remainder portion data in a last column of the initial parallel data, comprises the steps of:
- generating first CRC bits in accordance with the initial parallel data other than the remainder portion data;
- selecting second CRC bits having predetermined number of bytes, from the generated first CRC bits;
- selecting a second parallel data having the same number of bytes as the second CRC bits, from the remainder portion data; and generating third CRC bits in accordance with the second CRC bits and the second parallel data.

The initial parallel data may be a $2^n$-bytes parallel data, and the predetermined number may be $2^{n-m}$, where n is a natural number and m is a natural number selected from 1 to n.

The CRC encoding method may further comprise the steps of:

detecting the remainder portion data from the last column of the initial parallel data;

wherein the second parallel data having the predetermined number of bytes is selected from the detected reminder portion data.

The initial parallel data may be a variable-length data.

In accordance with a third aspect of the invention, a data sending device comprises:

a CRC encoding circuit for generating CRC bits in accordance with an initial parallel data having a remainder portion data in a last column of the initial parallel data, comprises: a first parallel encoding unit for generating first CRC bits in accordance with the initial parallel data other than the remainder portion data; a CRC bits selector for selecting second CRC bits having predetermined number of bytes, from the first CRC bits generated by the first parallel encoding unit; a parallel data selector for selecting a second parallel data having the same number of bytes as the second CRC bits, from the remainder portion data; and a second parallel encoding unit for generating third CRC bits in accordance with the second CRC bits and the second parallel data.

The initial parallel data may be a $2^n$-bytes parallel data, and the predetermined number may be $2^{n-m}$, where n is a natural number and m is a natural number selected from 1 to n.

The CRC encoding circuit may further comprise:

a detecting unit for detecting the remainder portion data from the last column of the initial parallel data;

wherein the parallel data selector selects the second parallel data having the predetermined number of bytes, from the reminder portion data detected by the detecting unit.

The initial parallel data may be a variable-length data.

In accordance with a fourth aspect of the invention, a data receiving device comprises:

a CRC encoding circuit for generating CRC bits in accordance with an initial parallel data having a remainder portion data in a last column of the initial parallel data, comprises: a first parallel encoding unit for generating first CRC bits in accordance with the initial parallel data other than the remainder portion data; a CRC bits selector for selecting second CRC bits having predetermined number of bytes, from the first CRC bits generated by the first parallel encoding unit; a parallel data selector for selecting a second parallel data having the same number of bytes as the second CRC bits, from the remainder portion data; and a second parallel encoding unit for generating third CRC bits in accordance with the second CRC bits and the second parallel data.

The initial parallel data may be a $2^n$-bytes parallel data, and the predetermined number may be $2^{n-m}$, where n is a natural number and m is a natural number selected from 1 to n.

The CRC encoding circuit may further comprise:

a detecting unit for detecting the remainder portion data from the last column of the initial parallel data;

wherein the parallel data selector selects the second parallel data having the predetermined number of bytes, from the reminder portion data detected by the detecting unit.

The initial parallel data may be a variable-length data.

According to the present invention, even when the parallel data with a long frame, such as 16-bytes parallel data, is sequentially inputted into the CRC encoding circuit, the CRC bits of the inputted parallel data can be generated by using simple circuit composition. This can suppress an increase in circuit scale and in manufacturing cost.

BRIEF DESCRIPTION OF THE DRAWINGS

The present invention will become more fully understood from the detailed description given hereinbelow and the accompanying drawing which are given by way of illustration only, and thus are not intended as a definition of the limits of the present invention, and wherein.

DETAILED DESCRIPTION OF PREFERRED EMBODIMENTS

Hereinafter, a CRC encoding circuit and a CRC encoding method in accordance with the present invention, will be explained with reference to the drawings.

In the present embodiment, for explanation ease, the generation of CRC bits from 16-bytes parallel data will be explained.

Firstly, the composition of the embodiment will be explained.

Figure 1:
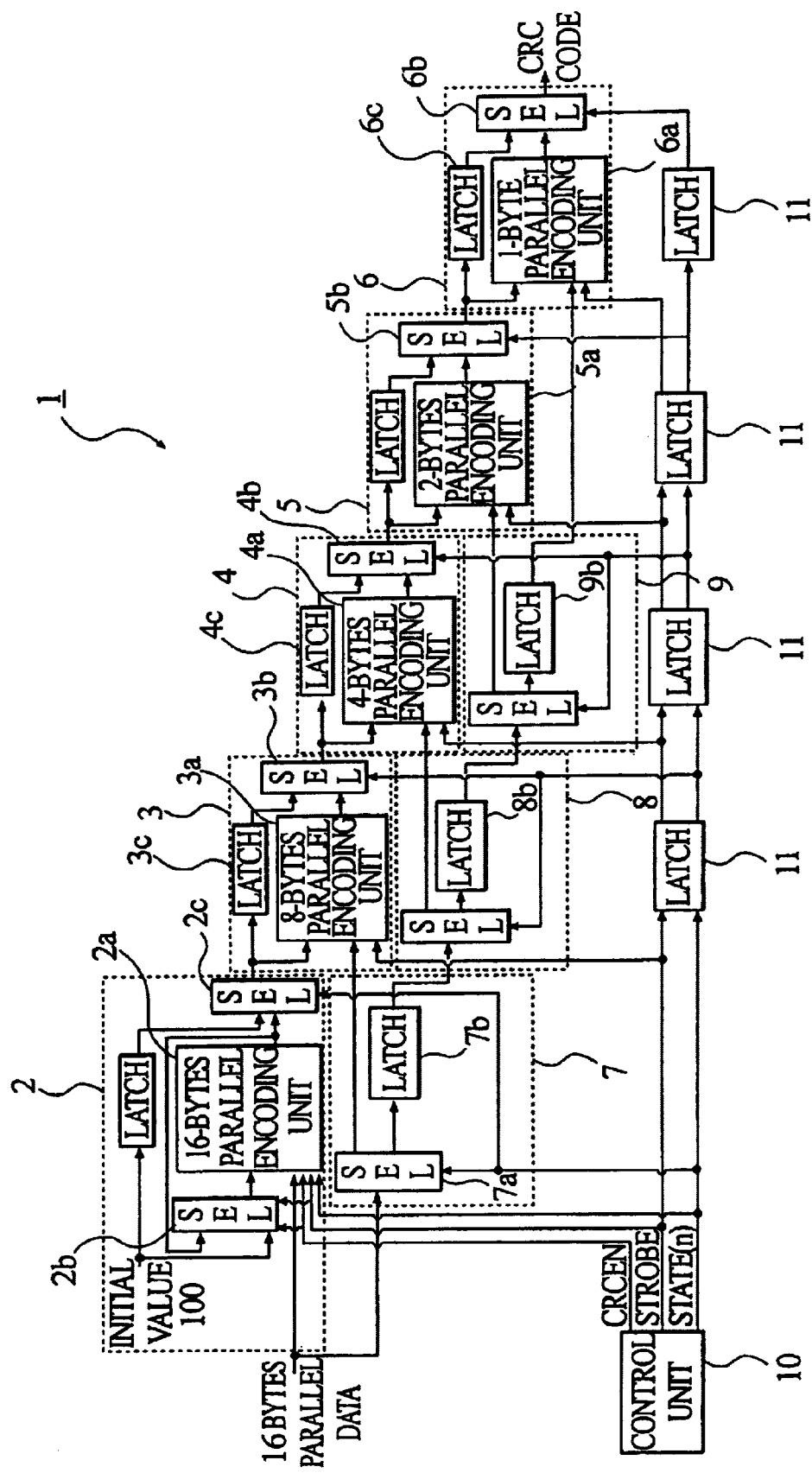
FIG. 1 shows circuit composition of a CRC encoding circuit 1 according to the present invention.

As shown in FIG. 1, a CRC encoding circuit 1 mainly comprises a 16-bytes parallel CRC encoder 2 (hereinafter, simply referred to as "a 16-bytes encoder 2"), an 8-bytes parallel CRC encoder 3 (hereinafter, simply referred to as "an 8-bytes encoder 3"), a 4-bytes parallel CRC encoder 4 (hereinafter, simply referred to as "a 4-bytes encoder 4"), a 2-bytes parallel CRC encoder 5 (hereinafter, simply referred to as "a 2-bytes encoder 5"), a 1-byte parallel CRC encoder 6 (hereinafter, simply referred to as "a 1-byte encoder 6"), a 15-bytes parallel data selecting section 7 (hereinafter, simply referred to as "a 15-bytes selecting section 7"), a 7-bytes parallel data selecting section 8 (hereinafter, simply referred to as "a 7-bytes selecting section 8"), a 3-bytes parallel data selecting section 9 (hereinafter, simply referred to as "a 3-bytes selecting section 9"), a control unit 10 and a plurality of latches 11.

The 16-bytes encoder 2 comprises a 16-bytes parallel encoding unit 2a, a CRC bits selector (SEL) 2b and a CRC bits selector (SEL) 2c. In the case that the variable-length 16-bytes parallel data outputted from an external circuit (not shown) is 16 bytes or more, the 16-bytes encoder 2 encodes the data (shown in FIG. 2 D1, D2) other than the last column to CRC bits by 16 bytes in accordance with an initial value 100, by synchronizing with control signals outputted from the control unit 10. Then, the result of the encoding is outputted to the 8-bytes encoder 3. In this case, the SEL 2c of the 16-bytes encoder 2 selects the CRC bits generated by the 16-bytes parallel encoding unit 2a. On the other hand, in the case that the inputted 16-bytes parallel data is less than 16 bytes, the 16-bytes encoder 2 outputs the initial value 100 to the 8-bytes encoder 3 without encoding the less than 16 bytes data to CRC bits.

The 8-bytes encoder 3 comprises a 8-bytes parallel encoding unit 3a, a CRC bits selector (SEL) 3b and a latch 3c. The 8-bytes encoder 3 selects either the data generated by encoding the data outputted from the 15-bytes selecting section 7 by using the 8-bytes parallel encoding unit 3a, or the data generated by latching the encoded interim result from the 16-bytes encoder 2 in the latch 3c, by synchronizing with a control signal outputted from the control unit 10. Then, the selected data is outputted to the 4-bytes encoder 4.

Concretely, on one hand, in the case that the remainder portion data of the last column (see FIG. 2) is 8 to 15 bytes, the 8-bytes encoder 3 encodes the 8-bytes parallel data outputted from the 15-bytes selecting section 7 to CRC bits, in accordance with the data outputted from the 16-bytes encoder 2 as an initial value for encoding the data. Then, the result of the encoding is outputted to 4-bytes encoder 4. In this case, the SEL 3b of the 8-bytes encoder 3 selects the CRC bits generated by the 8-bytes parallel encoding unit 3a. On the other hand, in the case that the remainder portion data of the last column (see FIG. 2) is less than 8 bytes, the 8-bytes encoder 3 latches the data outputted from the 16-bytes encoder 2 without encoding the less than 8 bytes of the data to CRC bits. Then, the latched data is outputted to the 4-bytes encoder 4. In this case, the SEL 3b selects the data generated by latching the encoded interim result from the 16-bytes encoder 2.

Similarly, the 4-bytes encoder 3 comprises a 4-bytes parallel encoding unit 4a, a CRC bits selector (SEL) 4b and a latch 4c. The 4-bytes encoder 4 selects either the data generated by encoding the data outputted from the 7-bytes selecting section 8 by using the 4-bytes parallel encoding unit 4a, or the data generated by latching the encoded interim result from the 8-bytes encoder 3 in the latch 4c, by synchronizing with a control signal outputted from the control unit 10. Then, the selected data is outputted to the 2-bytes encoder 5.

Concretely, on one hand, in the case that the unencoded remainder portion data of the last column is 4 to 7 bytes, the 4-bytes encoder 4 encodes the 4-bytes parallel data outputted from the 7-bytes selecting section 8 to CRC bits, in accordance with the data outputted from the 8-bytes encoder 3 as an initial value for encoding the data. Then, the result of the encoding is outputted to 2-bytes encoder 5. In this case, the SEL 4b of the 4-bytes encoder 4 selects the CRC bits generated by the 4-bytes parallel encoding unit 4a. On the other hand, in the case that the unencoded remainder portion data in the last column data is less than 4 bytes, the 4-bytes encoder 4 latches the data outputted from the 8-bytes encoder 3 without encoding the less than 4 bytes of the data to CRC bits. Then, the latched data is outputted to the 2-bytes encoder 5. In this case, the SEL 4b selects the data generated by latching the encoded interim result from the 8-bytes encoder 3.

Further similarly, the 2-bytes encoder 5 selects either the data generated by encoding the data outputted from the 3-bytes selecting section 9 by using a 2-bytes parallel encoding unit 5a, or the data generated by latching the encoded interim result from the 4-bytes encoder 4 in a latch 5c. Then, the selected data is outputted to the 1-byte encoder 6. Further, the 1-byte encoder 6 selects either the data generated by encoding the data outputted from the 3-bytes selecting section 9 by using a 1-bytes parallel encoding unit 6a, or the data generated by latching the encoded interim result from the 2-bytes encoder 5 in a latch 6c. Then, the selected data is outputted as a final encoded result.

The 15-bytes selecting section 7 comprises a parallel data selector (SEL) 7a and a latch 7b. In the case that the last column data of the 16-bytes parallel data, which is outputted from an external circuit (not shown), is 8 to 15 bytes (shown in FIG. 2, D3), the 15-bytes selecting section 7 outputs upper 8-bytes data of the last column data to the 8-bytes encoder 3, and latches remaining lower data in the latch 7b to output the latched data to the 7-bytes selecting section 8, by synchronizing with the control signal outputted from the control unit 10. On the other hand, in the case that the last column data is less than 8 bytes, the 15-bytes selecting section 7 does not output the less than 8 bytes of the data to the 8-bytes encoder 3 but latches the less than 8 bytes of the data in the latch 7b. Then, the 15-bytes selecting section 7 outputs the latched less than 8 bytes of the data to the 7-bytes selecting section 8.

Similarly, in the case that the remaining data (unencoded data) of the last column, which is outputted from the latch 7b, is 4 to 7 bytes, the 7-bytes selecting section 8 outputs upper 4-bytes data of the remaining data to the 4-bytes encoder 4, and latches the remaining lower data in a latch 8b to output the latched data to the 3-bytes selecting section 9. On the other hand, in the case that the remaining data (unencoded data) of the last column, which is outputted from the latch 7b, is less than 4 bytes, the 7-bytes selecting section 8 does not output the less than 4 bytes of the data to the 4-bytes encoder 4 but latches the less than 4 bytes of the data in the latch 8b. Then, the 7-bytes selecting section 8 outputs the less than 4 bytes of the data to the 3-bytes selecting section 9.

In the case that the remaining data (unencoded data) of the last column, which is outputted from the latch 8b, is 2 to 3 bytes, the 3-bytes selecting section 9 outputs upper 2-bytes data of the remaining data to the 2-bytes encoder 5, and latches the remaining lower data in a latch 9b to output the latched data to the 1-byte encoder 6. On the other hand, in the case that the remaining data (unencoded data) of the last column, which is outputted from the latch 8b, is 1 byte, the 3-bytes selecting section 9 do not outputs the 1-byte data to the 2-bytes encoder 5 but latches the 1-byte data in the latch 9b. Then, the 3-bytes selecting section 9 outputs the latched 1-byte data to the 1-byte encoder 6.

The control unit 10 detects the data of the last column of the inputted 16-bytes parallel data (REMAINDER PORTION DATA shown in FIG. 2), and the number of the bytes thereof The control unit 10 outputs various control signals which will be mentioned and performs the control for generating CRC bits in accordance with the 16-bytes parallel data inputted into the CRC encoding circuit 1.

The latch 11 latches the various control signals outputted from the control unit 10, and outputs the latched signals to a next latch 11 and to each of the above-mentioned CRC encoders.

Here, the 16-bytes parallel data for generating CRC bits and the various control signals (CRCEN, STROBE, STATE [n] shown in FIG. 1) outputted from the control unit 10 will be explained.

The 16-bytes parallel data is the communication data with a variable-length data frame, and is inputted into the 16-bytes encoder 2 and into the 15-bytes selecting section 7.

The CRCEN (CRC ENABLE) signal is one which indicates the extent that CRC bits are generated. The CRCEN signal is inputted into the 16-bytes encoder 2 only.

The STROBE signal is one for indicating the data of the last column of the 16-bytes parallel data. The STROBE signal is inputted into the 16-bytes encoder 2, the 8-bytes encoder 3, and the latch 11 respectively.

The STATE[n] signal is one for indicating the number of the bytes included in the data of the last column which is indicated by the above-mentioned STROBE signal. The STATE[n] signal is inputted into the 16-bytes encoder 2, the SEL 7a, and the latch 11 respectively.

Next, the operation of the CRC encoding circuit 1 in accordance with the present invention, will be explained. The procedure for generating CRC bits in accordance with 16-bytes parallel data will be explained with reference to FIG. 1 and FIG. 2.

Figure 2:
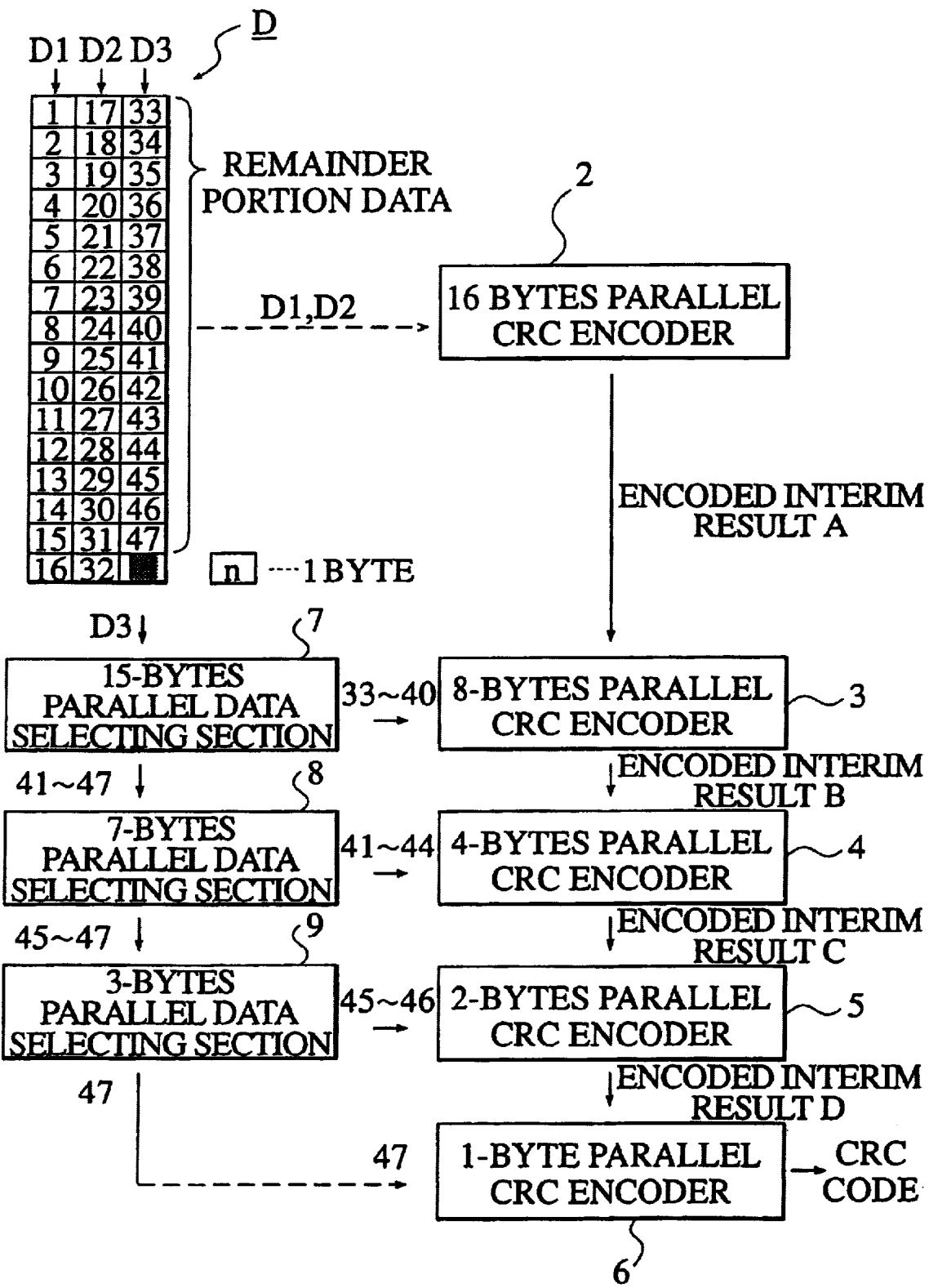
FIG. 2 shows a view for explaining the procedure which generates CRC bits in accordance with 16-bytes parallel data by using the CRC encoding circuit of FIG. 1.
Figure 3:
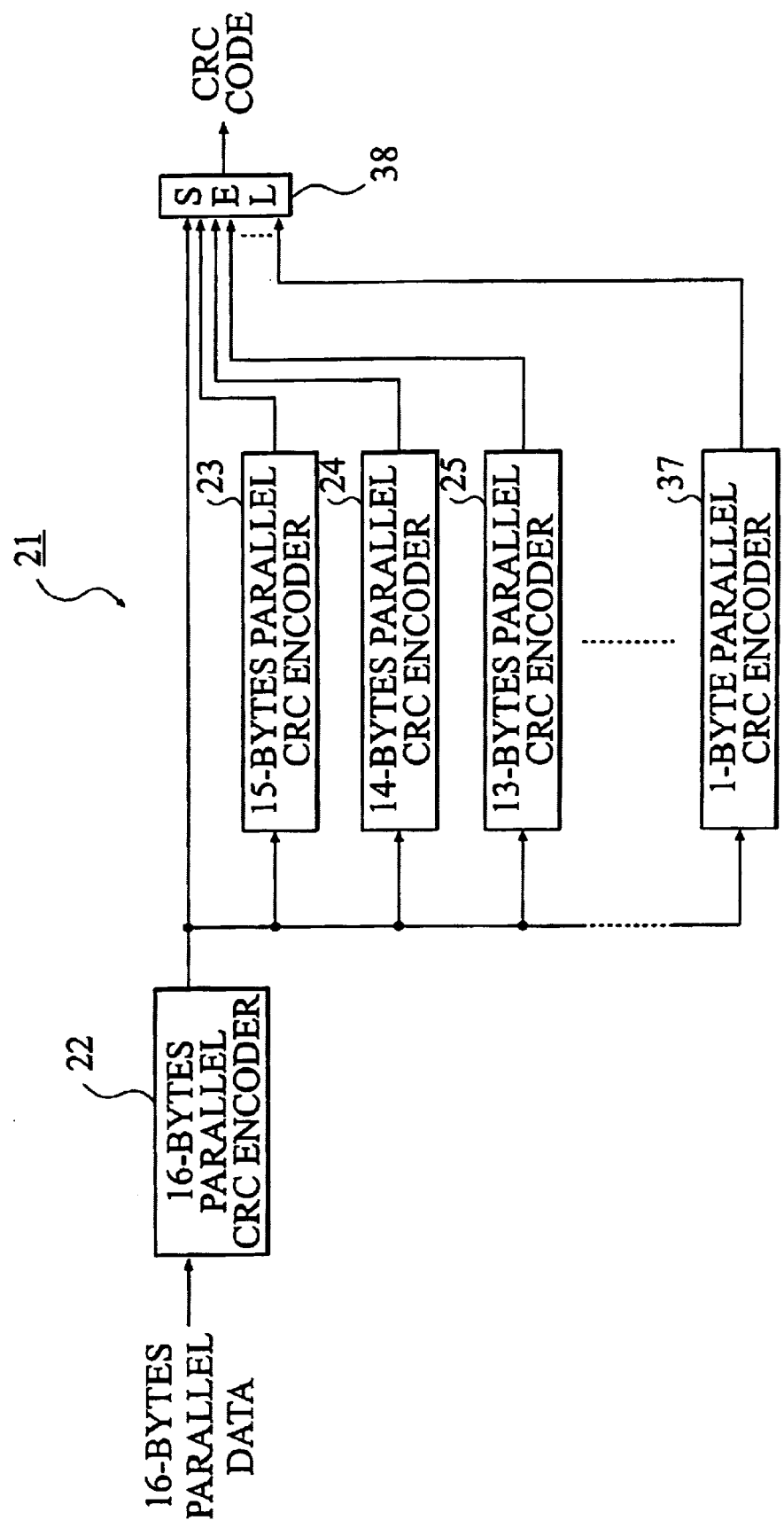
FIG. 3 shows circuit composition of a former CRC encoding circuit 21.
Figure 4:
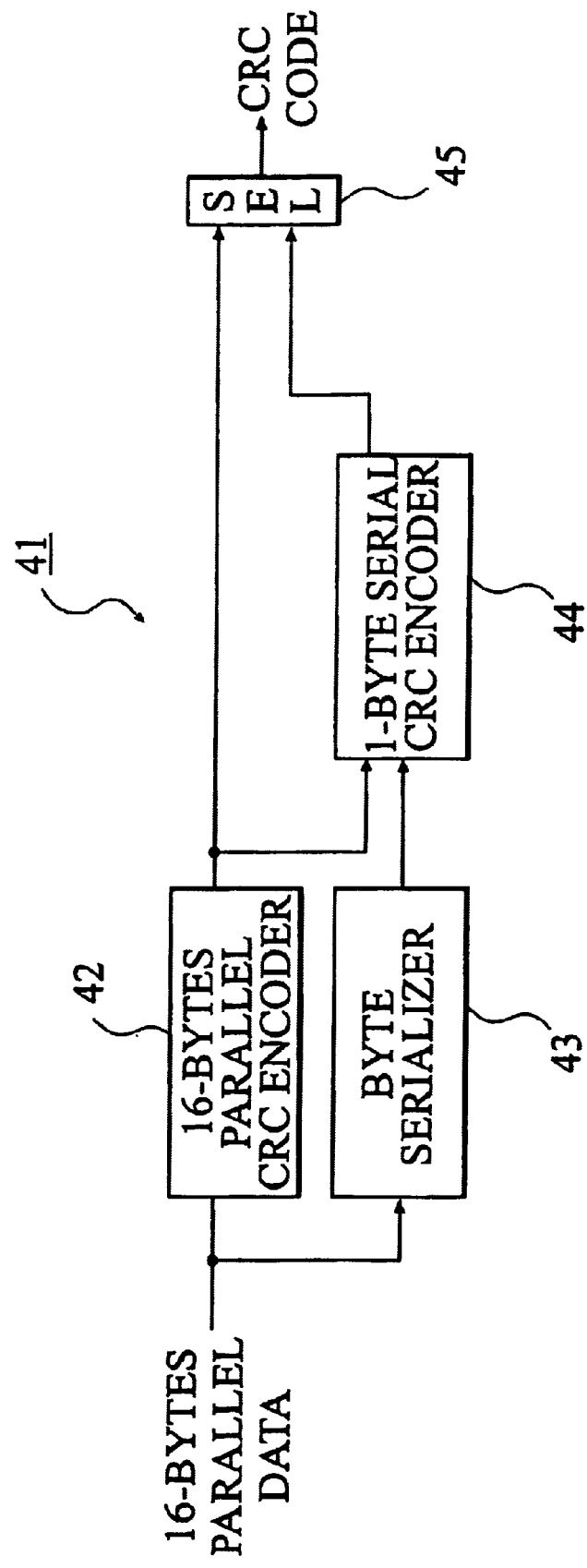
FIG. 4 shows circuit composition of a former CRC encoding circuit 41.

As shown in FIG. 2, the 16-bytes parallel data "D" with 47-bytes frame lengths (1 to 47) has three columns D1 (1 to 16), D2 (17 to 32), D3 (33 to 47) of parallel data. The last column D3 has 15 bytes of remainder portion data (33 to 47) and 1 byte of ineffective data (the mesh box shown in FIG. 2).

On the one hand, the data D1 and D2 of the above-mentioned 16-bytes parallel data "D" (the data other than the remainder portion data D3), is inputted into the 16-bytes encoder 2. The 16-bytes parallel encoding unit 2a encodes the inputted 16-bytes parallel data D1, D2. The result of the encoding is selected by the SEL 2c, and the selected result is outputted to the 8-bytes encoder 3 as an encoded interim result "A". Concretely, at first, the data D1 is encoded by the 16-bytes parallel encoding unit 2a, thereby CRC bits are generated. Then, the data D2 is encoded by the 16-bytes parallel encoding unit 2a in accordance with the generated CRC bits. As a result, new CRC bits are generated, and the new CRC bits are output to the SEL 2c. The SEL 2c selects the new CRC bits generated by the 16-bytes parallel encoding unit 2a. Finally, the selected CRC bits are outputted to the 8-bytes encoder 3 as the encoded interim result "A".

On the other hand, the data D3 of the 16-bytes parallel data "D", is divided into upper 8-bytes data (33 to 40) and lower 7-bytes data (41 to 47) by the 15-bytes selecting section 7. The upper 8-bytes data is inputted into the 8-bytes encoder 3. The lower 7-bytes data is inputted into the 7-bytes selecting section 8. In the case that the frame-length of the inputted 16-bytes parallel data "D" is less than 16 bytes, the initial value 100 is inputted into the 8-bytes encoder 3.

Subsequently, the upper 8-bytes data (33 to 40) outputted from the 15-bytes selecting section 7, is encoded to CRC bits by the 8-bytes encoder 3 in accordance with the encoded interim result "A" selected by the SEL 2c as an initial value. Then, the encoded data is inputted into the 4-bytes encoder 4 as an encoded interim result "B". That is, the SEL 3b selects the CRC bits generated by the 8-bytes parallel encoding unit 3a. Then, the selected CRC bits are inputted into the 4-bytes encoder 4 as the encoded interim result "B".

The lower 7-bytes data (41 to 47) outputted from the 15-bytes selecting section 7, is divided into upper 4-bytes data (41 to 44) and lower 3-bytes data (45 to 47) by the 7-bytes selecting section 8. The upper 4-bytes data is inputted into the 4-bytes encoder 4. The lower 3-bytes data is inputted into the 3-bytes selecting section 9.

Subsequently, the upper 4-bytes data (41 to 44) outputted from the 7-bytes selecting section 8, is encoded to CRC bits by the 4-bytes encoder 4 in accordance with the encoded interim result "B" selected by the SEL 3b as an initial value. Then, the encoded data is inputted into the 2-bytes encoder 5 as an encoded interim result "C". That is, the SEL 4b selects the CRC bits generated by the 4-bytes parallel encoding unit 4a. Then, the selected CRC bits are inputted into the 2-bytes encoder 5 as the encoded interim result "C".

The lower 3-bytes data (45 to 47) outputted from the 7-bytes selecting section 8, is divided into upper 2-bytes data (45 and 46) and lower 1-byte data (47) by the 3-bytes selecting section 9. The upper 2-bytes data is inputted into the 2-bytes encoder 5. The lower 1-byte data is inputted into the 1-byte encoder 6.

Subsequently, the upper 2-bytes data (45 and 46) outputted from the 3-bytes selecting section 9, is encoded to CRC bits by the 2-bytes encoder 5 in accordance with the encoded interim result "C" selected by the SEL 4b as an initial value. Then, the encoded data is inputted into the 1-byte encoder 6 as an encoded interim result "D". That is, the SEL 5b selects the CRC bits generated by the 2-bytes parallel encoding unit 5a. Then, the selected CRC bits are inputted into the 1-byte encoder 6 as the encoded interim result "D".

The lower 1-bytes data (47) outputted from the 3-bytes selecting section 9, is encoded to CRC bits by the 1-byte encoder 6 in accordance with the encoded interim result "D" selected by the SEL 5b as an initial value. Then, the encoded data is outputted as a final encoded result. That is, the SEL 6b selects the CRC bits generated by the 1-byte parallel encoding unit 6a. Then, the selected CRC bits are outputted as the final encoded result.

As mentioned above, because the CRC encoding circuit 1 in accordance with the present invention comprises n−1 CRC encoders for encoding $2^{n-m}$ (m=1 to n)-bytes parallel data, the CRC encoding circuit 1 has the function that the remainder portion data in a last column of the 16-bytes parallel data which is inputted as variable-length data can be encoded and sequentially processed in accordance with the CRC bits encoded by a plurality of CRC encoders.

Thus, even when the parallel data having a long frame, such as 16-bytes parallel data, is inputted into the CRC encoding circuit 1, the CRC bits of the inputted parallel data can be generated by using simple circuit composition. This can suppress the increase in circuit scale of the CRC encoding circuit and in manufacturing cost thereof Furthermore, at most, n byte(s) parallel CRC encoders are sufficient for $2^n$-bytes parallel data in the CRC encoding circuit of the present invention. Thus, even when 4 bytes or more of parallel data is sequentially inputted into the CRC encoding circuit 1, the CRC bits of the parallel data can be generated.

The content of the description of this embodiment is a suitable example of the CRC encoding circuit in accordance with the present invention. The present invention is not limited to this.

For example, although the inputted variable-length data is 16-bytes parallel data in this embodiment, the present invention may be applied to $2^n$-bytes parallel data by having n byte(s) parallel CRC encoders and n−1 bytes parallel data selecting sections. Further, the number of bytes of the remainder portion data in a last column of parallel data, may be optional.

Furthermore, the CRC encoding circuit in accordance with the present invention, may be applied to a data sending device and a data receiving device. In this case, both of these devices generate CRC bits. Then, by making a comparison with each of the CRC bits, an error of data can be detected in the data communication.

In addition, with respect to the detailed composition of the CRC encoding ailed operation of the CRC encoding circuit 1, or the like, various other suitably made without departing from the gist of the present invention.

The entire disclosure of Japanese Patent Application No. Tokugan 2000-333090 filed on Oct. 31, 2000 including specification, claims, drawings and summary are incorporated herein by reference in its entirety.

What is claimed is:

1. A CRC encoding circuit for generating CRC bits in accordance with a parallel data having a remainder portion data comprising:
    a first encoding unit for generating a first computed result in accordance with the parallel data other than the remainder portion data and a predetermined initial value;
    a first CRC bits selector for selecting first CRC bits from the predetermined initial value and the first computed result;
    a parallel data selector for selecting a data having a predetermined number of bytes from the remainder portion data;
    a second encoding unit for generating a second computed result in accordance with the data selected by the parallel data selector, and the first CRC bits; and
    a second CRC bits selector for selecting second CRC bits from the first CRC bits and the second computed result.

2. The CRC encoding circuit as claimed in claim 1, wherein the first CRC bits encoding unit generates the first computed result in accordance with a $2^n$ byte parallel data other than a remainder portion data by $2^n$ byte parallel computing, where n is a natural number.

3. The CRC encoding circuit as claimed in claim 2, wherein the parallel data selector comprises a selecting unit for selecting the data of $2^{n-m}$ bytes and the second encoding unit comprises an encoding portion for generating the second computed result by $2^{n-m}$ byte parallel computing, where m is a natural number not more than n.

4. The CRC encoding circuit as claimed in claim 3, wherein the second encoding unit comprises the n encoding portions for generating the second computed result by $1, 2^1, 2^2 \ldots 2^{n-1}$ byte parallel computing respectively.

5. The CRC encoding circuit as claimed in claim 4, wherein the parallel data selector comprises the n−1 selecting units for selecting the data of $2^1, 2^2 \ldots 2^{n-1}$ bytes respectively.

6. The CRC encoding circuit as claimed in claim 1, further comprising a detector unit for detecting the remainder portion data from a last column of the parallel data; and
    wherein the parallel data selector selects the data having the predetermined number of bytes, from the remainder portion data detected by the detector unit.

7. A CRC encoding method for generating CRC bits in accordance with a parallel data having a remainder portion data comprising:
    generating a first computed result in accordance with the parallel data other than the remainder portion data and a predetermined initial value;
    selecting a first CRC bits from the predetermined initial value and the first computed result;
    selecting a data having a predetermined number of bytes from the remainder portion data;
    generating a second computed result in accordance with the selected data having the predetermined number of bytes and the first CRC bits; and
    selecting a second CRC bits from the first CRC bits and the second computed result.

8. The CRC encoding method as claimed in claim 7, wherein in the generating of the first computed result, the first computed result is generated in accordance with a $2^n$ byte parallel data other than a remainder portion data by $2^n$ byte parallel computing, where n is a natural number.

9. The CRC encoding method as claimed in claim 8, wherein in the selecting of the data, the data of $2^{m-n}$ bytes is selected and in the generating of the second computed result, the second computed result is generated by $2^{n-m}$ bytes parallel computing, where m is a natural number not more than n.

10. The CRC encoding circuit as claimed in claim 9, wherein in the generating of the second computed result, the second computed result is generated by respectively $1, 2^1, 2^2 \ldots 2^{n-1}$ byte parallel computing.

11. The CRC encoding method as claimed in claim 10, wherein in the selecting of the data the data of respectively $2^1, 2^2 \ldots 2^{n-1}$ bytes is selected.

12. The CRC encoding method as claimed in claim 7, further comprising:
    detecting the remainder portion data from a last column of the parallel data,
    wherein the data having the predetermined number of bytes is selected from the detected remainder portion data.

13. A data sending and receiving device for sending and receiving a parallel data comprising:
    a CRC encoding circuit for generating CRC bits in accordance with a parallel data having a remainder portion data comprising:
        a first encoding unit for generating a first computed result in accordance with the parallel data other than the remainder portion and a predetermined initial value;
        a first CRC bits selector for selecting a first CRC bits from the predetermined initial value and the first computed result;
        a parallel data selector for selecting a data having a predetermined number of bytes from the remainder portion data;
        a second encoding unit for generating a second computed result in accordance with the data selected by the parallel data selector and the first CRC bits; and
        a second CRC bits selector for selecting a second CRC bits from the first CRC bits and the second computed result.

14. The data sending and receiving device as claimed in claim 13, wherein the first CRC bits encoding unit generates the first computed result in accordance with a $2^n$ byte parallel data other than a remainder portion data by $2^n$ byte parallel computing, where n is a natural number.

15. The data sending and receiving device as claimed in claim 14, wherein the parallel data selector comprises a selecting unit for selecting the data of $2^{n-m}$ bytes and the second encoding unit comprises an encoding portion for generating the second computed result by $2^{n-m}$ byte parallel computing, where m is a natural number not more than n.

16. The data sending and receiving device as claimed in claim 15, wherein the second encoding unit comprises n pieces of the encoding portions for generating the second computed result by $1, 2^1, 2^2 \ldots 2^{n-1}$ byte parallel computing respectively.

17. The data sending and receiving device as claimed in claim 16, wherein the parallel data selector comprises n−1 pieces of the selecting units for selecting the data of $2^1, 2^2 \ldots 2^{n-1}$ bytes respectively.

18. The data sending and receiving device as claimed in claim 13, wherein the CRC encoding unit further comprises a detector unit for detecting the remainder portion data from a last column of the parallel data,
    wherein the parallel data selector selects the data having the predetermined number of bytes, from the remainder portion data detected by the detector unit.

* * * * *